(12) United States Patent
Li et al.

(10) Patent No.: US 7,557,042 B2
(45) Date of Patent: Jul. 7, 2009

(54) METHOD FOR MAKING A SEMICONDUCTOR DEVICE WITH REDUCED SPACING

(75) Inventors: Chi Nan Brian Li, Austin, TX (US); Cheong M. Hong, Austin, TX (US); Rana P. Singh, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 606 days.

(21) Appl. No.: 10/878,839

(22) Filed: Jun. 28, 2004

(65) Prior Publication Data

US 2005/0287810 A1    Dec. 29, 2005

(51) Int. Cl.
*H01L 21/302* (2006.01)

(52) U.S. Cl. .............. 438/696; 438/201; 438/257; 438/593; 438/734; 438/749

(58) Field of Classification Search .......... 438/201, 438/257, 593, 696, 734, 749
See application file for complete search history.

(56) References Cited

U.S. PATENT DOCUMENTS 6,417,049 B1 * 7/2002 Sung et al. ............ 438/266
6,620,681 B1   9/2003 Kim et al.
6,709,921 B2 * 3/2004 Yeh et al. .............. 438/257

OTHER PUBLICATIONS

Song, Yunheub et al., "Highly Manufacturable 90nm NOR Flash Technology with $0.081um^2$ Cell Size," 2003 Symposium on VLSI Technology Digest of Technical Papers, 2 pages.
Kitamura, Takuya et al., "A Low Voltage Operating Flash Memory Cell with High Coupling Ratio Using Horned Floating Gate with Fine HSG," 1998 Symposium on VLSI Digest of Technical Papers, 1998 IEEE, pp. 104-105.

* cited by examiner

*Primary Examiner*—George A. Goudreau
(74) *Attorney, Agent, or Firm*—James L. Clingan, Jr.; David G. Dolezal

(57) ABSTRACT

Floating gates are formed in two separate polysilicon depositions steps resulting in distinct portions. The first formed portions are between isolation regions. A thick insulator is formed over the isolation regions and floating gate portions. The thick insulator is patterned to leave fences over the isolation regions. A thinning process, an isotropic etch in this example, is applied to these fences to make them thinner. Polysilicon sidewall spacers are formed on the sides of these fences. These sidewall spacers become the second portion of the floating gate. These second portions have the desired shape for significantly increasing the capacitance to the subsequently formed control gates, thereby reducing the gate voltage required for programming and erasing made by a relatively robust process.

24 Claims, 6 Drawing Sheets

METHOD FOR MAKING A SEMICONDUCTOR DEVICE WITH REDUCED SPACING

FIELD OF THE INVENTION

This invention relates to semiconductor devices, and more particularly, to a method for reducing spacing in semiconductor devices.

RELATED ART

Floating gate memory cells have generally been the non-volatile memory of choice in manufacturing. As the devices have continued to get smaller, the voltages have gotten smaller as well. Attempts to accommodate this for floating gate have included attempts to increase the capacitive coupling between the control gate and the floating gate. This has the effect of allowing for a reduction in gate voltage for programming and erasing. To achieve this for floating gate it has become desirable to have the floating gates very close together. This requires a thin region between the floating gates which has been difficult to obtain. For example, simply etching through the polysilicon and filling with an insulator is difficult to manufacture because of the difficulties in filling a very narrow slit that is deep, i.e., a narrow slit with a high aspect ratio. Fill of this type is difficult to ensure that no voids are formed. Voids adversely impact the structural integrity, which is essential to this type of usage.

Thus, there is a need for to provide a method for at least reducing one or more of problems stated above.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, the floating gates are formed in two separate polysilicon depositions steps resulting in distinct portions. The first formed portions are between isolation regions. A thick insulation is formed over the isolation regions and floating gate portions. The thick insulator is patterned to leave fences over the isolation regions. An isotropic etch is formed on these fences to make them thinner. Polysilicon sidewall spacers are formed on the sides of these fences. These sidewall spacers become the second portion of the floating gate. These second portions have the desired shape for significantly increasing the capacitance to the subsequently formed control gates, thereby reducing the gate voltage required for programming and erasing made by a relatively robust process. This is better understood by reference to the figures and the following description.

Figure 1:
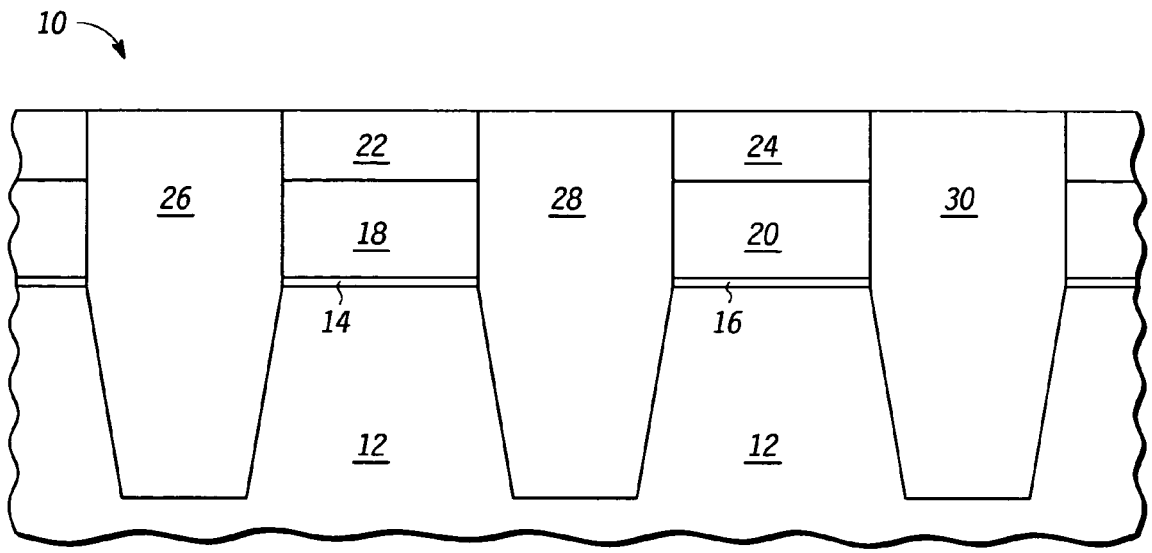
FIG. 1 is a cross section of a semiconductor structure at a first stage in processing useful in the method of an embodiment of the invention.

Shown in FIG. 1 is a semiconductor structure 10 comprising a substrate 12, a gate dielectric 14, a gate dielectric 16, a polysilicon portion 18 on gate dielectric 14, a polysilicon portion 20 on gate dielectric 16, a nitride portion 22 on polysilicon portion 18, a nitride portion 24 on polysilicon portion 20, an isolation region 26 adjacent to gate dielectric 14, an isolation region between gate dielectric 14 and gate dielectric 16, and an isolation region 30 adjacent to gate dielectric 16. Substrate 12 is preferably of silicon but could be another semiconductor material. Gate dielectrics 14 and 16 are preferably silicon oxide but could be another suitable dielectric.

Figure 2:
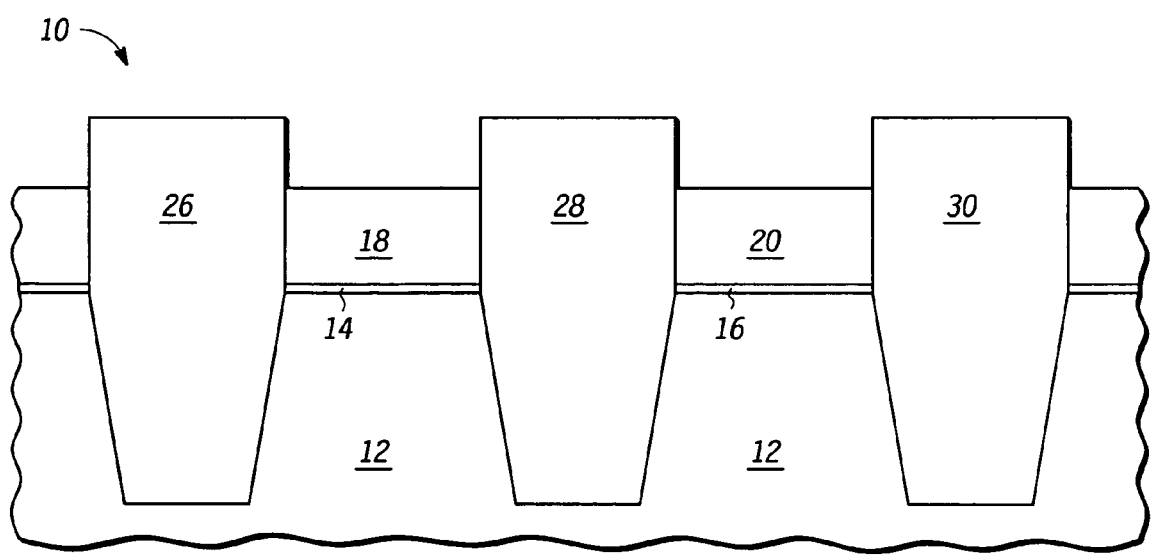
FIG. 2 is a cross section of the semiconductor structure of FIG. 1 at a subsequent stage in processing.

Shown in FIG. 2 is semiconductor structure 10 after removal of nitride portions 22 and 24.

Figure 3:
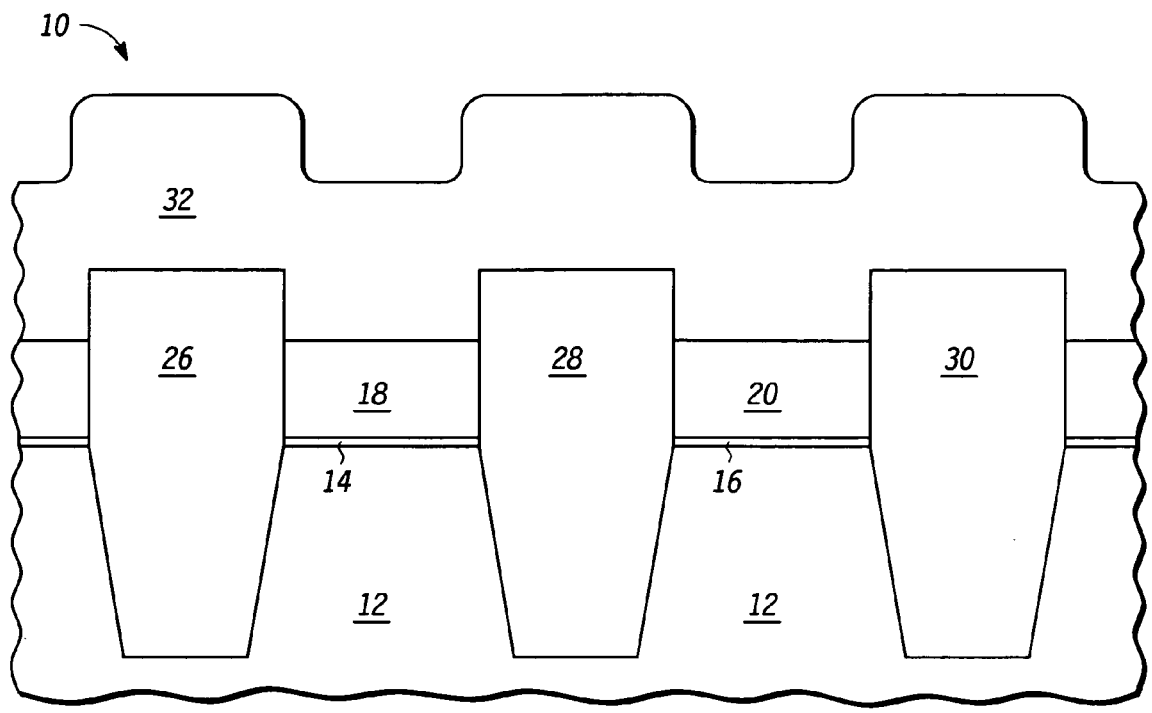
FIG. 3 is a cross section of the semiconductor structure of FIG. 2 at a subsequent stage in processing.

Shown in FIG. 3 is semiconductor structure 10 after depositing an insulating layer 32, which is preferably TEOS (an oxide made using tetraethylorthosilicate), but could be another material. In this example, it is an insulating material but it does not necessarily have to be insulating because it is eventually completely removed.

Figure 4:
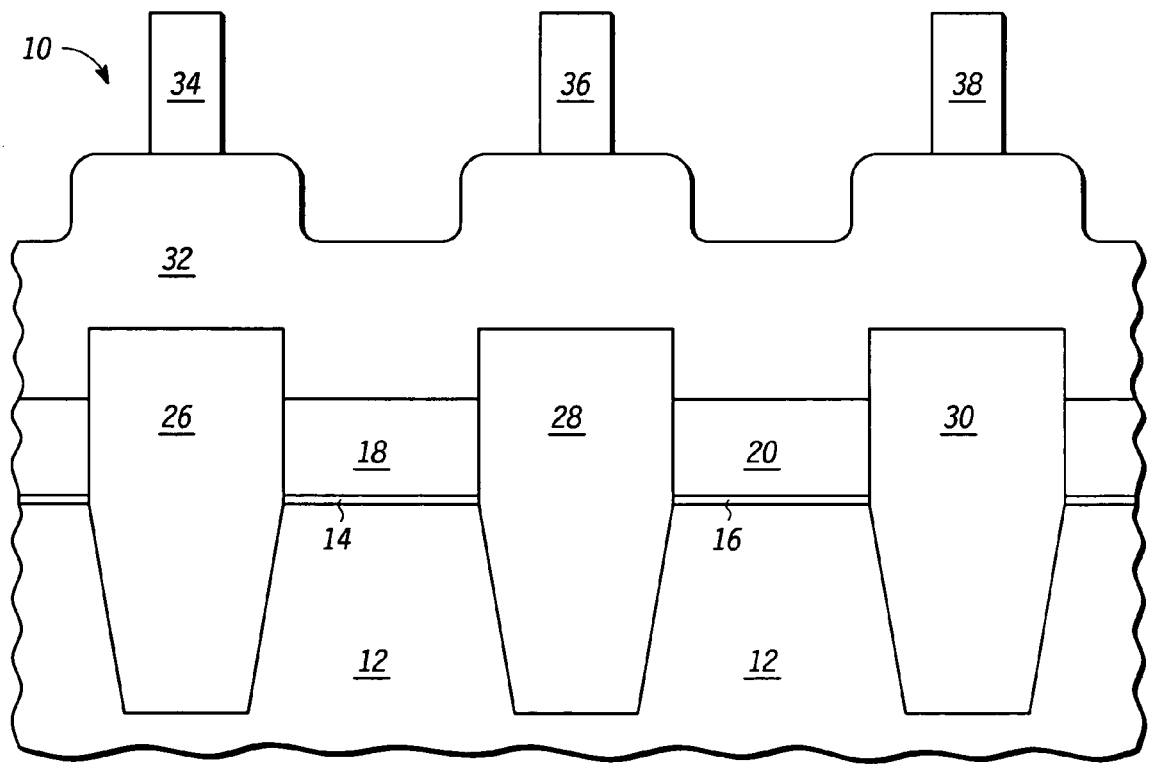
FIG. 4 is a cross section of the semiconductor structure of FIG. 3 at a subsequent stage in processing.

Shown in FIG. 4 is a semiconductor structure 10 after depositing and patterning a photoresist layer to leave photoresist portions 34, 36, and 38 over isolation regions 26, 28, and 30, respectively. These photoresist portions are preferably the minimum available width. This minimum width is set by a combination of the available processes and the lithography capability. A typical minimum width in current manufacturing processes is about 0.13 micron. This will surely be reduced in the near future and will likely continue to be reduced.

Figure 5:
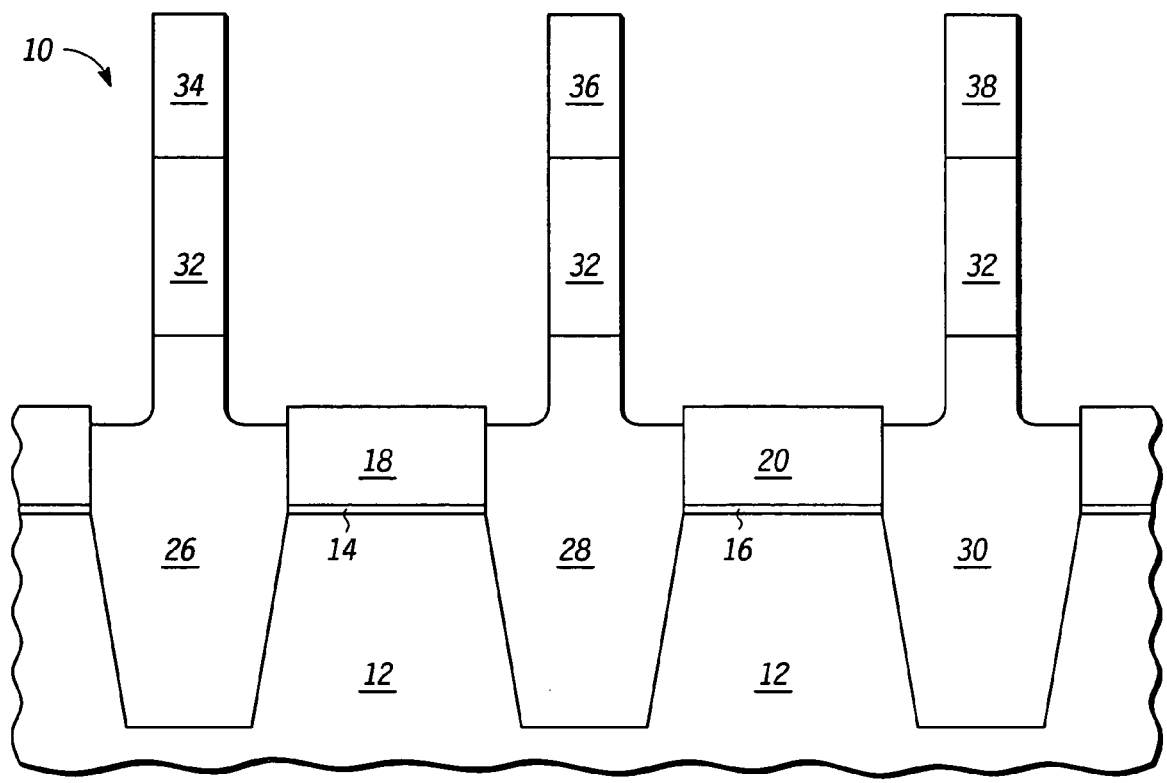
FIG. 5 is a cross section of a semiconductor structure of FIG. 4 at a subsequent stage in processing 4.

Shown in FIG. 5 is semiconductor structure 10 after an anisotropic etch of insulating layer 32 using photoresist portions 34, 36, and 38 as a mask leaving portions of insulating layer 32 under photoresist portions 34, 36, and 38. This also shows that this etch can extend past the thickness of insulating layer 32 and etch into isolation regions 26, 28, and 30. This overetch is preferable to stopping upon reaching the isolation regions. An effective approach for this etch is to use a dry HF etch.

Figure 6:
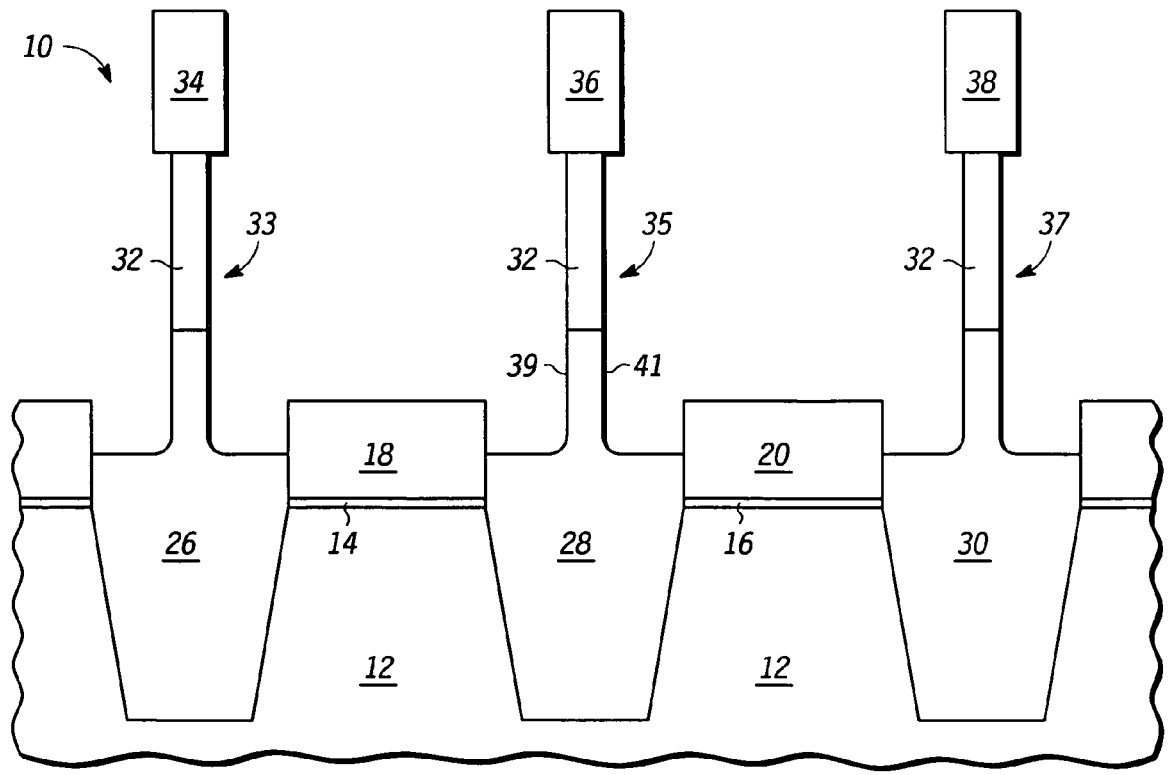
FIG. 6 is a cross section of the semiconductor structure of FIG. 5 at a subsequent stage in processing.

Shown in FIG. 6 is semiconductor structure 10 after an isotropic etch of oxide. This a thinning process that reduces the lateral dimension of the remaining portions of insulating layer 32 as well as the overetched portions of isolation regions 26, 28, and 30. These remaining portions of oxide are fences 33, 35, and 37 as shown in FIG. 6. A thinning procedure such as this should be able to safely reduce the lateral dimension by half. Thus, fences have a lateral dimension of about half the lateral dimension of photoresist portions 34, 36, and 38. As an example, fence 32 has a sidewall 39 on the side adjacent to polysilicon portion 18 and a sidewall 41 on the side adjacent to polysilicon portion 20.

Figure 7:
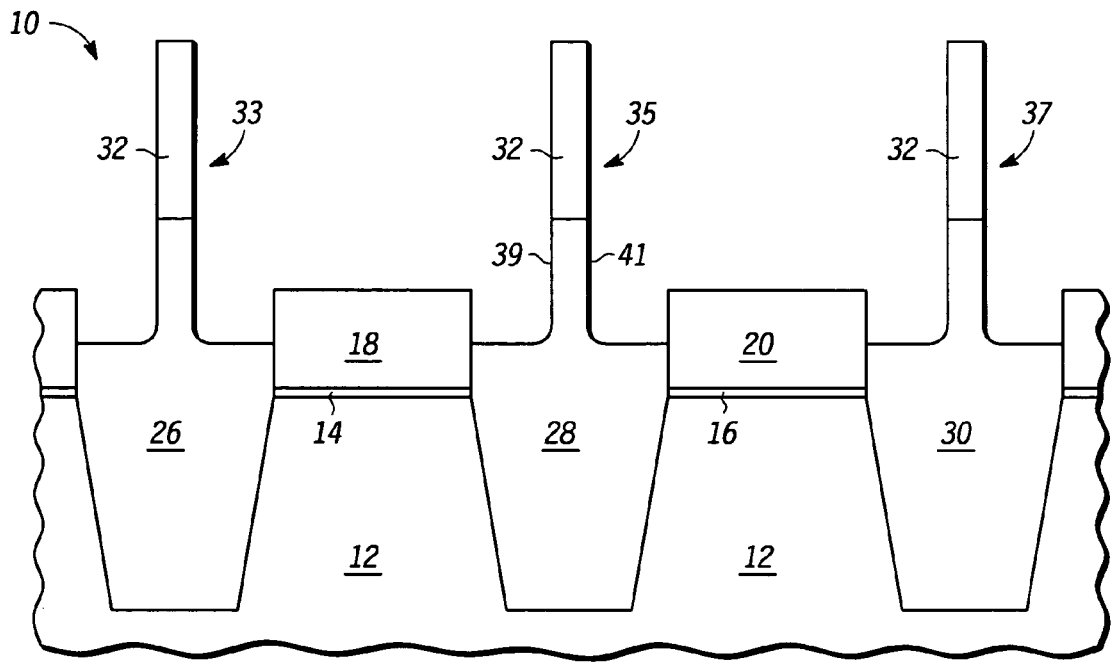
FIG. 7 is a cross section of the semiconductor structure of FIG. 6 at a subsequent stage in processing.

Shown in FIG. 7 is semiconductor structure 10 after removal of photoresist portions 34, 36, and 38. These leaves fences 33, 35, and 37 without a photoresist cap. Because these fences 33, 35, and 37 were formed as part of a deposited TEOS layer, they have substantial structural integrity. This is particularly advantageous compared to insulators that have been formed as part of a fill process where it may not be possible to ensure that the fill is free of voids. Because these fences 33, 35, and 37 have been thinned, they provide a dimension below what would normally be available and thus provide, ultimately, for increased control gate to floating gate capacitance for a given distance between polysilicon portions 18 and 20.

Figure 8:
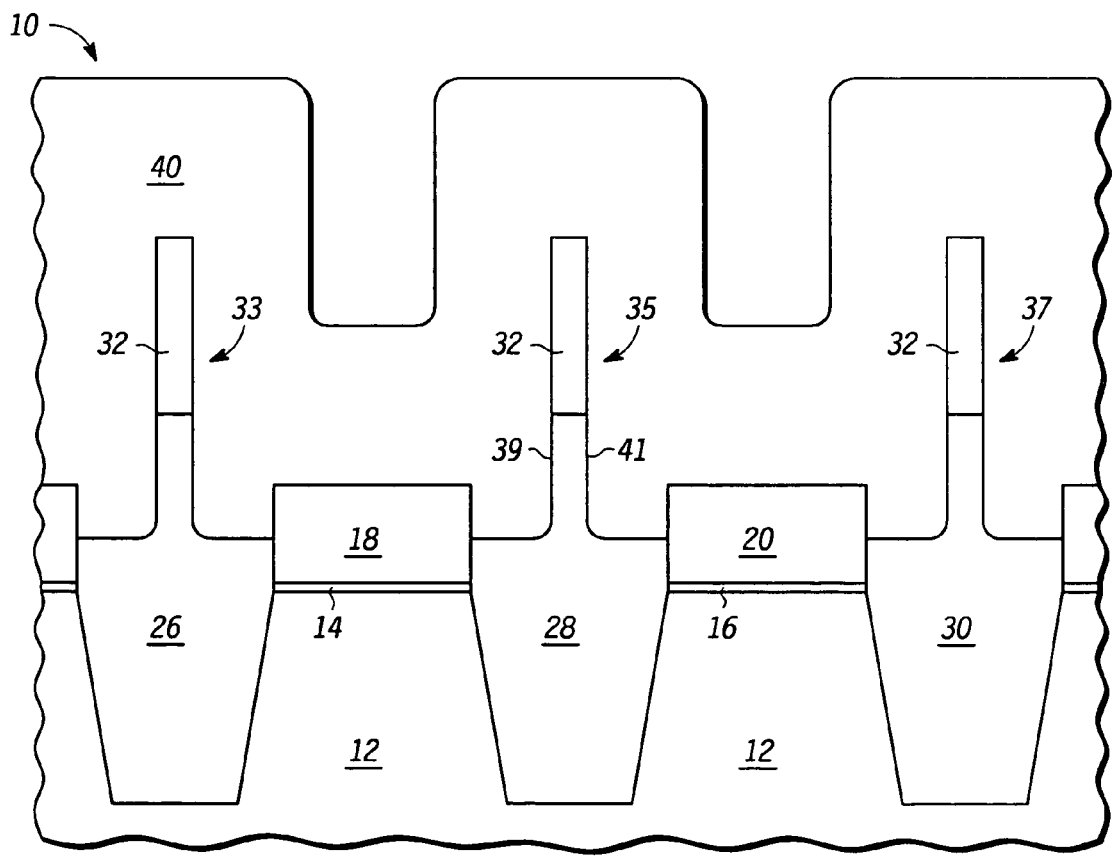
FIG. 8 is a cross section of a semiconductor structure according to a third embodiment of the invention at a stage in processing.

Shown in FIG. 8 is semiconductor structure after depositing a layer 40 of polysilicon. Polysilicon easily deposits very conformally to leave slits 41 and 43 between fences 33, 35, and 37. This thickness of polysilicon is sufficient to ensure that slits 41 and 43 do not extend laterally past polysilicon portions 18 and 20.

Figure 9:
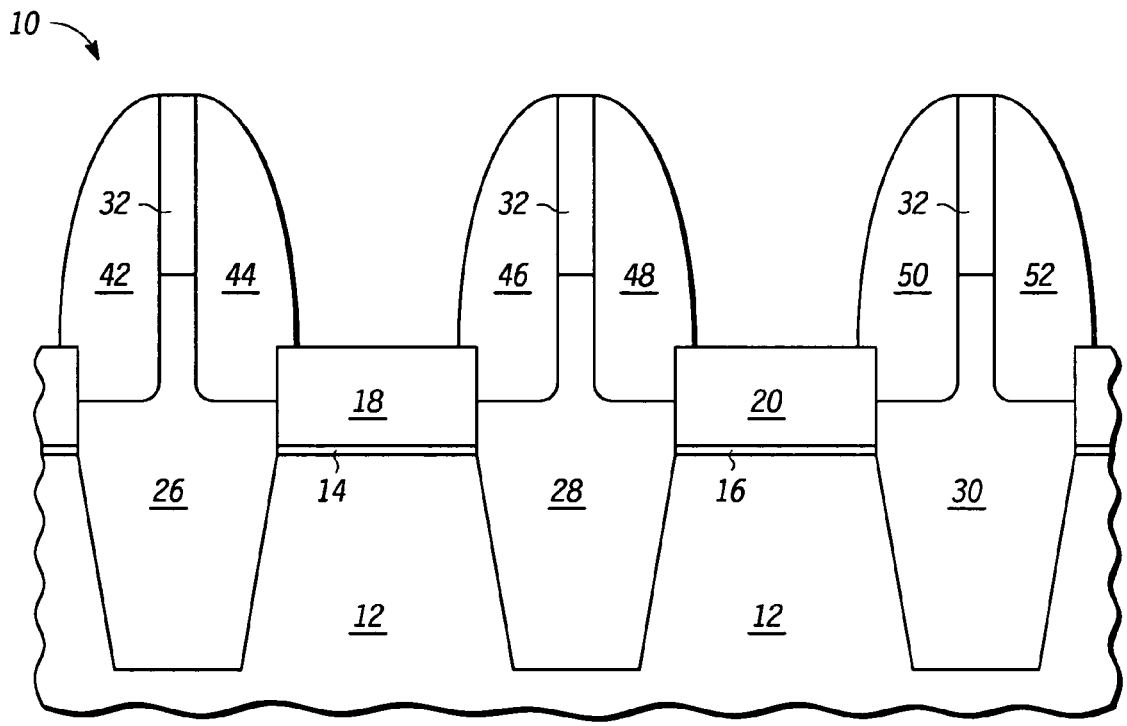
FIG. 9 is a cross section of the semiconductor structure of FIG. 8 at a subsequent stage in processing.

Shown in FIG. 9 is semiconductor structure after an anisotropic etch of layer 40. This results in spacers 42 and 44 of polysilicon on opposite sides of fence 33, spacers 46 and 48 of polysilicon on opposite sides of fence 35, and spacers 50 and 52 of polysilicon on opposite sides of fence 37. Spacers 44 and 46 are physically in contact with polysilicon portion 18 and together with portion 18 form a floating gate. Similarly spacers 48 and 50 are physically in contact with polysilicon portion 20 and together with portion 20 form a floating gate. These floating gates have a significant vertical component to its surface to greatly increase the total surface between the floating the not-yet-formed control gate.

Figure 10:
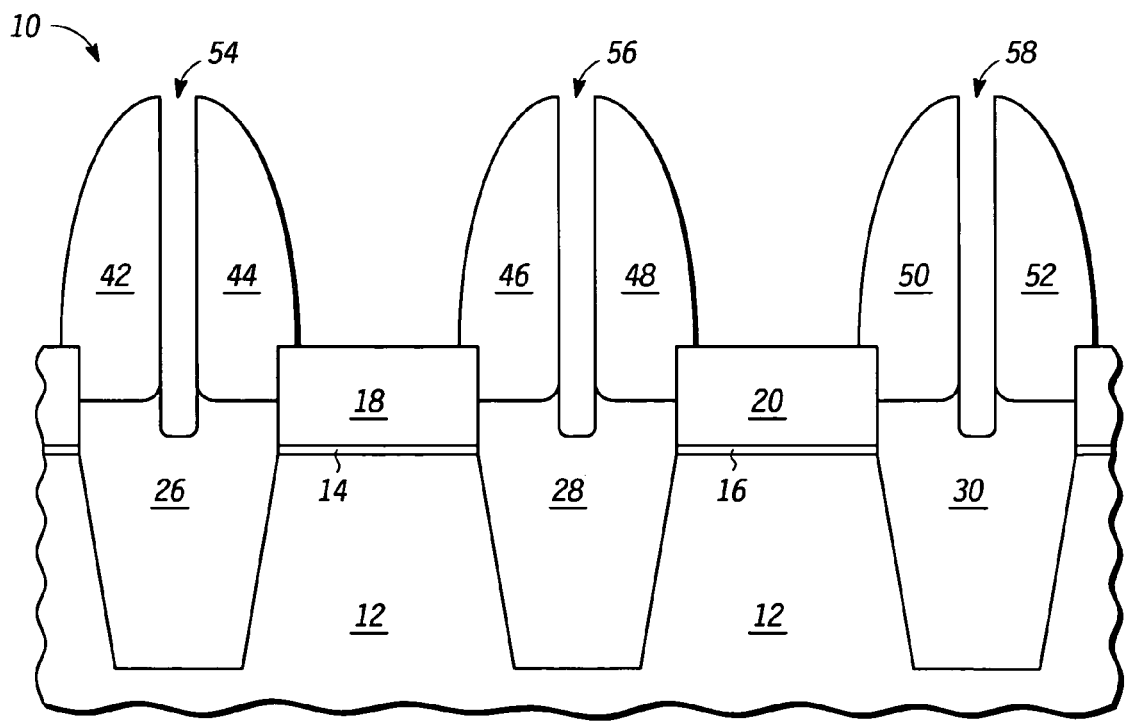
FIG. 10 is a cross section of the semiconductor structure of FIG. 9 at a subsequent stage in processing.

Shown in FIG. 10 is semiconductor structure 10 after removal of fences 33, 35, and 37. This removal process is achieved by an oxide etch that can also beneficially remove portions of isolation regions 26, 28, and 30. The result is the formation of slits 54, 56, and 58 in place of fences 33, 35, and 37, respectively. Slits 54, 56, and 58 preferably penetrate to the depth of polysilicon portion 20. In this example they are shown penetrating below the depth of polysilicon portion 20.

Figure 11:
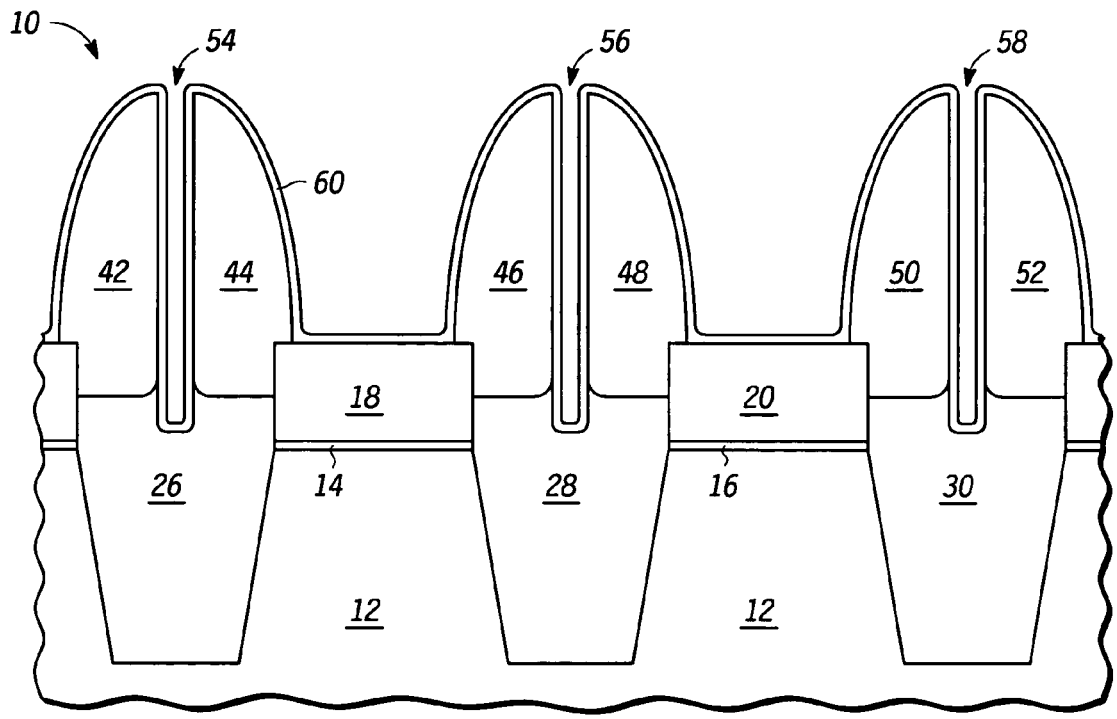
FIG. 11 is a cross section of the semiconductor structure of FIG. 10 at a subsequent stage in processing.

Shown in FIG. 11 is semiconductor structure 10 after formation of an oxynitride layer 60, which can be grown or deposited. In the example of FIG. 11, oxynitride layer 60 is deposited. This oxynitride layer 60

Figure 12:
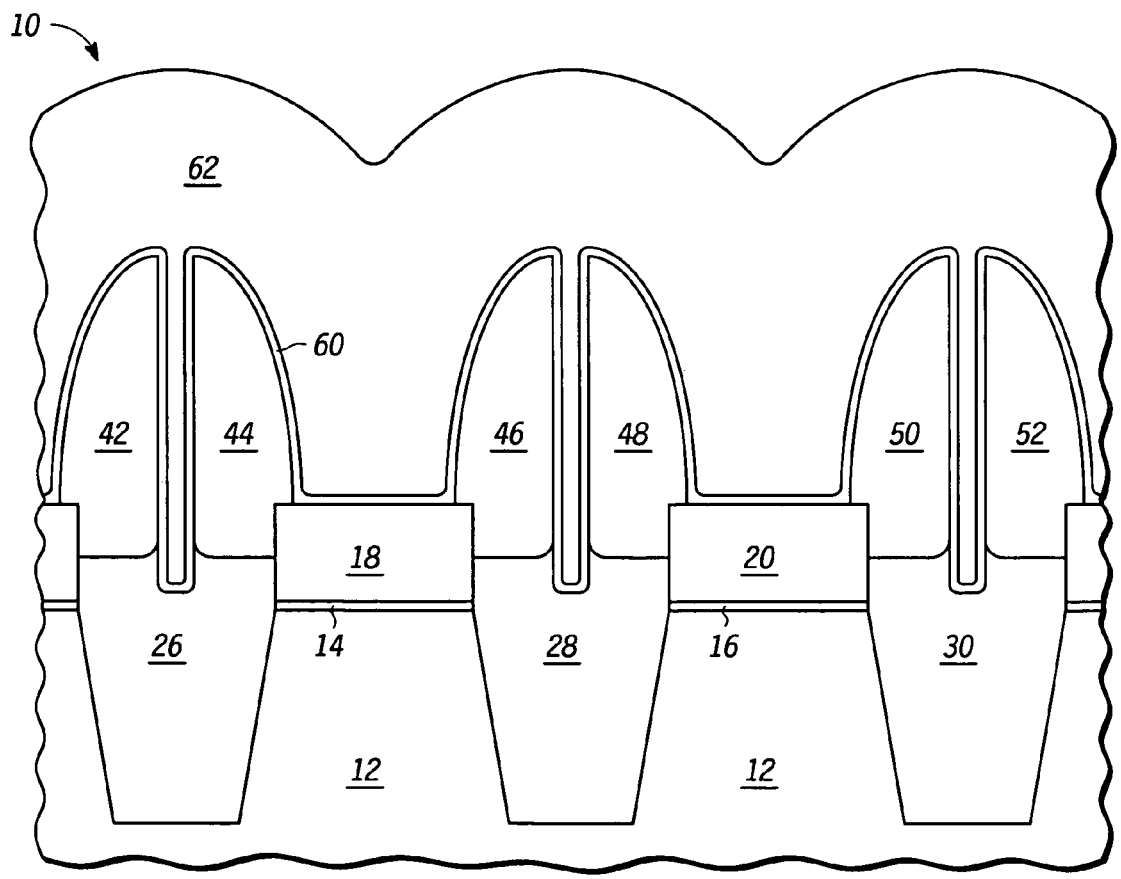
FIG. 12 is a cross section of the semiconductor structure of FIG. 11 at a subsequent stage in processing.

Shown in FIG. 12 is semiconductor structure 100 after depositing polysilicon layer 62 which functions as a control gate. This layer 62 fills slits 54, 56, and 58 that enhances the coupling between control and floating gate. By this filling the slits 54, 56, and 58, the control gate, polysilicon layer 62, is on both sides of each spacer 42, 44, 46, 48, 50, and 52. Polyslicon layer 62 is subsequently etched not visible in this cross section to form it as a word line. Spacers 42, 44, 46, 48, 50, and 52 and polysilicon portions 18 and 20 are also etched at this time to form the individual floating gates for individual memory cells. Also in virtually applications there will be regular logic transistors also formed that do not have floating gates and that the gate for these transistors is conveniently deposited at the same time as polysilicon layer 62 is deposited.

In the foregoing specification, the invention has been described with reference to specific embodiments. However, one of ordinary skill in the art appreciates that various modifications and changes can be made without departing from the scope of the present invention as set forth in the claims below. For example, other embodiments not described herein may be implemented. Certain thicknesses and materials were described and these may be varied. Also the thinning process was described as being an isotropic etch but a different thinning process may also be used. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, the method comprising:
    forming a first structure including a first sidewall and a second sidewall, the first sidewall is opposite the second sidewall, wherein the first structure includes an oxide;
    thinning the first structure, wherein the thinning includes reducing the distance between the first sidewall and the second sidewall;
    forming a first semiconductor structure adjacent to the first sidewall subsequent to the thinning;
    forming a second semiconductor structure adjacent to the second sidewall subsequent to the thinning; and
    removing at least a portion of the first structure between the first semiconductor structure and the second semiconductor structure.

2. The method of claim 1 wherein the first structure is characterized as a dielectric structure.

3. The method of claim 1 wherein the first structure includes TEOS.

4. The method of claim 1 wherein the first semiconductor structure includes polysilicon and the second semiconductor structure includes polysilicon.

5. The method of claim 1 wherein the first semiconductor structure is characterized as a spacer and the second semiconductor structure is characterized as a spacer.

6. The method of claim 1 wherein the thinning further includes performing an isotropic etch.

7. The method of claim 1 wherein the forming the first structure includes:
    forming a first layer of material; and
    patterning the first layer of material.

8. The method of claim 7 wherein the thinning further includes performing an anisotropic etch of the first layer of material.

9. The method of claim 7 wherein the forming the first layer of material includes:
    depositing the first layer of material.

10. The method of claim 9 wherein the first layer of material includes a dielectric material.

11. The method of claim 1 wherein the removing includes forming a void between the first semiconductor structure and the second semiconductor structure, the method further comprising:
    forming a semiconductor material in the void.

12. The method of claim 1 further comprising:
    forming a first floating gate; and forming a second floating gate;

wherein the removing includes forming a void between the first semiconductor structure and the second semiconductor structure;

wherein the first floating gate includes at least a portion of the first semiconductor structure, and wherein the second floating gate includes at least a portion of the second semiconductor structure.

13. The method of claim 11 further comprising:

forming a word line, the word line including a portion located over the first floating gate and a portion located over the second floating gate, the forming the word line includes forming word line material in the void.

14. The method of claim 1 wherein the removing includes forming a void between the first semiconductor structure and the second semiconductor structure, the method further comprising forming a dielectric material in the void.

15. The method of claim 1 wherein the removing includes exposing a sidewall of the first semiconductor structure and exposing a sidewall of the second semiconductor structure at a location between the first semiconductor structure and the second semiconductor structure, the method further comprising:

forming a dielectric on the sidewall of the first semiconductor structure and forming a dielectric on the sidewall of the second semiconductor structure.

16. The method of claim 15 wherein the dielectric on the sidewall of the first semiconductor structure and the dielectric on the sidewall of the second semiconductor structure are each characterized as including an oxide, nitride, oxide configuration.

17. The method of claim 1 wherein the removing includes removing all of the first structure.

18. The method of claim 1 wherein the first structure is formed over an isolation region.

19. The method of claim 1 wherein the first semiconductor structure and the second semiconductor structure of semiconductor material are electrically isolated from each other.

20. The method of claim 1 wherein:

the forming the first structure includes forming a layer of first structure material and forming a patterned structure over the layer of first structure material;

the thinning includes etching the layer of first structure material with the patterned structure located over the first structure; and the method further includes removing the patterned structure subsequent to the thinning.

21. The method of claim 1 wherein the semiconductor device is further characterized as being in a semiconductor substrate having an isolation region between a first gate structure and a second gate structure, wherein:

the step of forming the first structure is further characterized by forming the first structure over the isolation region;

the step of forming the first semiconductor structure is further characterized by forming the first semiconductor structure in contact with the first gate structure;

the step of forming the second semiconductor structure is further characterized by forming the second semiconductor structure in contact with the second gate structure.

22. The method of claim 21 further comprising:

forming a dielectric layer on the first and second semiconductor structures and the first and second gate structures; and forming a conductive layer over the dielectric layer.

23. A method of making a semiconductor device on a semiconductor substrate having an isolation region between a first floating gate structure and a second floating gate structure, the method comprising:

forming a first structure including a first sidewall and a second sidewall, the first sidewall is opposite the second sidewall, wherein the first structure is formed over the isolation region, the first structure formed by depositing a first layer over the isolation region and ratterning the first layer to leave the first structure over a middle portion of the isolation region;

thinning the first structure, wherein the thinning includes reducing the distance between the first sidewall and the second sidewall;

forming a first semiconductor structure adjacent to the first sidewall subsequent to the thinning and in contact with the first floating gate structure;

forming a second semiconductor structure adjacent to the second sidewall subsequent to the thinning in contact with the second floating gate structure; and removing at least a portion of the first structure between the first semiconductor structure and the second semiconductor structure.

24. The method of claim 23 further comprising:

forming a dielectric layer on the first and second semiconductor structures and the first and second floating gate structures; and forming a conductive layer over the dielectric layer.

* * * * *